(12) United States Patent
Choi et al.

(10) Patent No.: US 10,778,226 B1
(45) Date of Patent: Sep. 15, 2020

(54) FAIL REDUNDANCY CIRCUITS

(71) Applicant: SK hynix Inc., Icheon-si, Gyeonggi-do (KR)

(72) Inventors: Geun Ho Choi, Icheon-si (KR); Min Gyu Park, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/460,270

(22) Filed: Jul. 2, 2019

(30) Foreign Application Priority Data

Mar. 5, 2019 (KR) .................. 10-2019-0025322

(51) Int. Cl.
  *G11C 7/00* (2006.01)
  *H03K 19/007* (2006.01)
  *G11C 29/00* (2006.01)
  *G11C 8/18* (2006.01)

(52) U.S. Cl.
  CPC .......... *H03K 19/0075* (2013.01); *G11C 8/18* (2013.01); *G11C 29/787* (2013.01)

(58) Field of Classification Search
  CPC .................................................. G11C 29/787
  USPC ....................................................... 365/200
  See application file for complete search history.

(56) References Cited

U.S. PATENT DOCUMENTS

| 7,652,330 | B1 | 1/2010 | Hackler, Sr. et al. | |
|---|---|---|---|---|
| 2006/0007762 | A1* | 1/2006 | Morzano | G11C 8/10 365/200 |
| 2009/0190423 | A1* | 7/2009 | Nakamura | G11C 29/24 365/200 |

FOREIGN PATENT DOCUMENTS

KR            100417056 B1     6/2004

* cited by examiner

*Primary Examiner* — Hoai V Ho
(74) *Attorney, Agent, or Firm* — William Park & Associates Ltd.

(57) ABSTRACT

A redundancy circuit includes a selection control signal generation circuit and a column control circuit. The selection control signal generation circuit drives an internal node, which is initialized, to generate a selection control signal when a logic level of a latched address signal is different from a logic level of a fuse signal. The column control circuit buffers a pre-column selection signal based on the selection control signal to generate a column selection signal for execution of a column operation of cells or to generate a redundancy column selection signal for execution of the column operation of redundancy cells.

19 Claims, 7 Drawing Sheets

FAIL REDUNDANCY CIRCUITS

CROSS-REFERENCE TO RELATED APPLICATIONS

The present application claims priority under 35 U.S.C 119(a) to Korean Application No. 10-2019-0025322, filed on Mar. 5, 2019, which is incorporated herein by reference in its entirety.

BACKGROUND

1. Technical Field

Embodiments of the present disclosure relate to fail redundancy circuits using a fuse signal.

2. Related Art

Semiconductor devices may store address information for accessing defective cells into a fuse set and may repair the defective cells by replacing the defective cells with redundancy cells when the defective cells are selected.

SUMMARY

According to an embodiment, a redundancy circuit includes a selection control signal generation circuit and a column control circuit. The selection control signal generation circuit drives an internal node, which is initialized, to generate a selection control signal when a logic level of a latched address signal is different from a logic level of a fuse signal. The column control circuit buffers a pre-column selection signal based on the selection control signal to generate a column selection signal for execution of a column operation of cells or to generate a redundancy column selection signal for execution of the column operation of redundancy cells.

According to another embodiment, a redundancy circuit includes a comparison circuit configured to compare a latched address signal with a fuse signal based on an enablement pulse and a pre-charge signal to generate a comparison signal, an internal node drive circuit configured to drive an internal node based on the comparison signal, a selection control signal output circuit configured to buffer a signal of the internal node to output the buffered signal of the signal of the internal node as a selection control signal, and a column control circuit configured to buffer a pre-column selection signal based on the selection control signal to generate a column selection signal for execution of a column operation of cells or to generate a redundancy column selection signal for execution of the column operation of redundancy cells.

DETAILED DESCRIPTION OF THE EMBODIMENTS

Various embodiments of the present disclosure are described hereinafter with reference to the accompanying drawings. However, the described embodiments are for illustrative purposes only and are not intended to limit the scope of the present disclosure.

Figure 1:
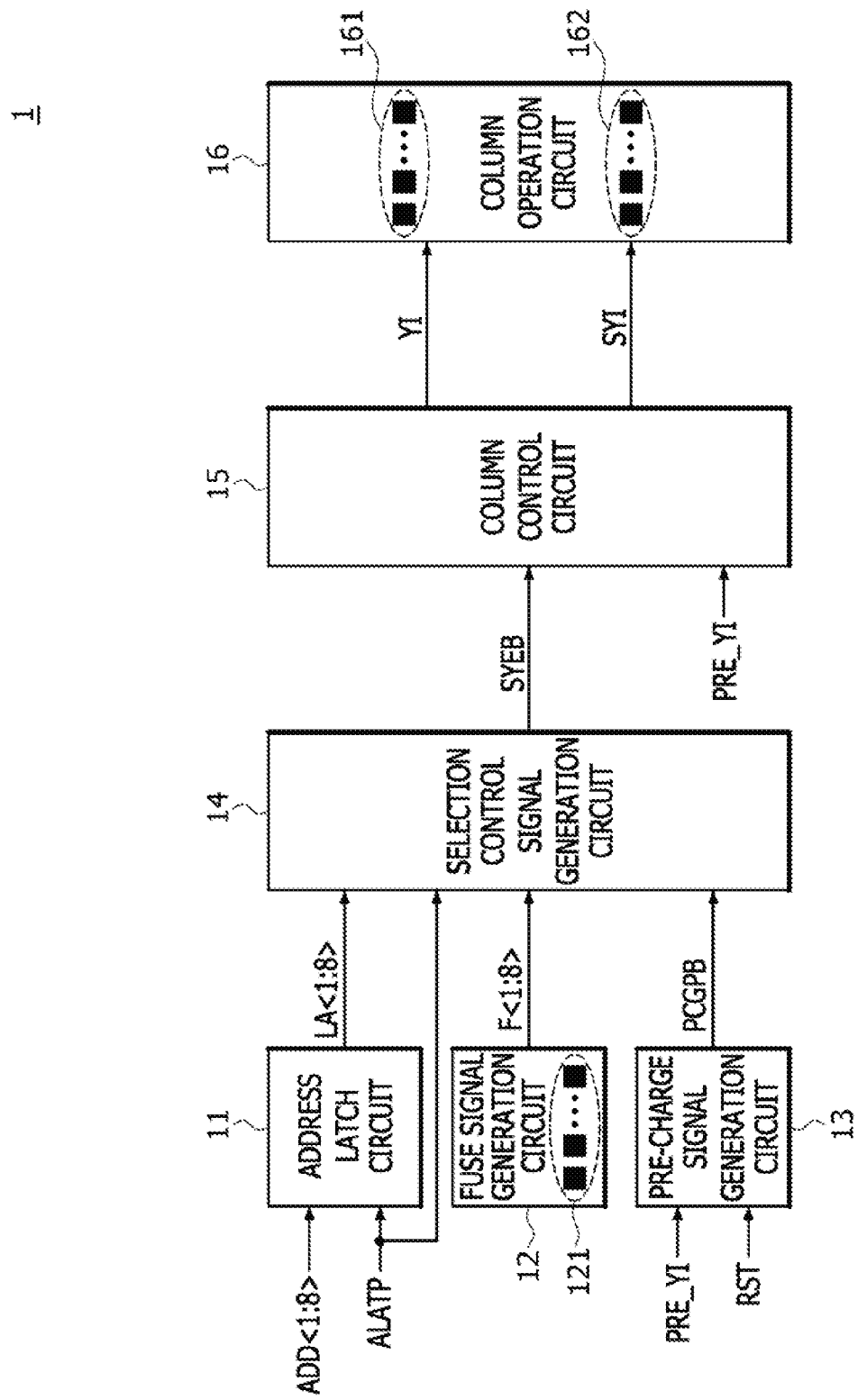
FIG. 1 is a block diagram illustrating a configuration of a redundancy circuit, according to an embodiment of the present disclosure.

As illustrated in FIG. 1, a redundancy circuit 1 according to an embodiment may include an address latch circuit 11, a fuse signal generation circuit 12, a pre-charge signal generation circuit 13, a selection control signal generation circuit 14, a column control circuit 15, and a column operation circuit 16.

The address latch circuit 11 may latch first to eighth address signals ADD<1:8> based on an address latch pulse ALATP and may output the latched signals of the first to eighth address signals ADD<1:8> as first to eighth latched address signals LA<1:8>. The address latch pulse ALATP may be generated for the address latch circuit 11 to receive the first to eighth address signals ADD<1:8> for accessing cells activated by a column operation when the column operation is performed. The column operation may be performed to select a data path for receiving or outputting data. The address latch circuit 11 is realized to latch address signals, the number of bits of which may be set to be different according to the embodiments. A configuration and an operation of the address latch circuit 11 is described in detail below with reference to FIG. 2.

The fuse signal generation circuit 12 may include a fuse set 121 having a plurality of fuses and may store first to eighth fuse signals F<1:8> into the fuse set 121. A logic level combination of the first to eighth fuse signals F<1:8> may correspond to a logic level combination of the first to eighth address signals ADD<1:8> which are inputted to the address latch circuit 11 when a cell 161 selected by the first to eighth address signals ADD<1:8> is a defective cell and is replaced with a redundancy cell 162. The fuse set 121 may include fuses that correspond to respective ones of the first to eighth fuse signals F<1:8>. The fuses of the fuse set 121 may include information on logic levels of the first to eighth fuse signals F<1:8>, which are determined according to electrical open/short states of the fuses. Logic level combinations of the first to eighth fuse signals F<1:8> and the first to eighth address signals ADD<1:8> may be set differently in different embodiments. The number of bits included in the fuse signals stored in the fuse signal generation circuit 12 may be set differently in different embodiments.

The pre-charge signal generation circuit 13 may generate a pre-charge signal PCGPB based on a pre-column selection signal PRE_YI and a reset signal RST. The pre-column selection signal PRE_YI may be generated to select a column path during the column operation. The reset signal RST may be generated to execute an initialization operation.

The pre-charge signal generation circuit 13 may generate the pre-charge signal PCGPB at a time when a predetermined delay period elapses from a time when the pre-column selection signal PRE_YI is generated for execution of the column operation. The pre-charge signal generation circuit 13 may generate the pre-charge signal PCGPB at a time when the reset signal RST is generated. A configuration and an operation of the pre-charge signal generation circuit 13 is described more fully below with reference to FIG. 3.

The word "predetermined" as used herein with respect to a parameter, such as a predetermined delay period, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The selection control signal generation circuit 14 may generate a selection control signal SYEB from the first to eighth latched address signals LA<1:8> and the first to eighth fuse signals F<1:8> based on the address latch pulse ALATP and the pre-charge signal PCGPB. The selection control signal generation circuit 14 may initialize the selection control signal SYEB to a first logic level when the pre-charge signal PCGPB is generated. The selection control signal generation circuit 14 may keep the selection control signal SYEB having the first logic level corresponding to an initialized state if a logic level combination of the first to eighth latched address signals LA<1:8> is identical to a logic level combination of the first to eighth fuse signals F<1:8> when the address latch pulse ALATP is generated. The selection control signal generation circuit 14 may generate the selection control signal SYEB having a second logic level if a logic level combination of the first to eighth latched address signals LA<1:8> is different from a logic level combination of the first to eighth fuse signals F<1:8> when the address latch pulse ALATP is generated. In an embodiment, the first logic level may be a logic "low" level, and the second logic level may be a logic "high" level. A configuration and an operation of the selection control signal generation circuit 14 is described more fully below with reference to FIGS. 4 and 5.

The column control circuit 15 may generate a column selection signal YI or a redundancy column selection signal SYI from the pre-column selection signal PRE_YI based on the selection control signal SYEB. The column control circuit 15 may buffer the pre-column selection signal PRE_YI to output the buffered signal of the pre-column selection signal PRE_YI as the redundancy column selection signal SYI when the selection control signal SYEB has the first logic level. The column control circuit 15 may buffer the pre-column selection signal PRE_YI to output the buffered signal of the pre-column selection signal PRE_YI as the column selection signal YI when the selection control signal SYEB has the second logic level. The column selection signal YI may be generated to perform the column operation of cells 161. The redundancy column selection signal SYI may be generated to perform the column operation of redundancy cells 162 with which the cells 161 are replaced when the cells 161 are failed cells. A configuration and an operation of the column control circuit 15 is described more fully below with reference to FIG. 6.

The column operation circuit 16 may perform the column operation of the cells 161 or the redundancy cells 162 based on the column selection signal YI and the redundancy column selection signal SYI. The column operation circuit 16 may perform the column operation of the cells 161 when the column selection signal YI is enabled. The column operation circuit 16 may perform the column operation of the redundancy cells 162 when the redundancy column selection signal SYI is enabled.

Figure 2:
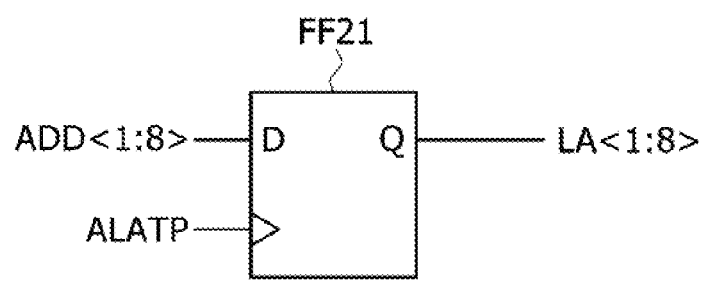
FIG. 2 is a circuit diagram illustrating an example of an address latch circuit included in the redundancy circuit of FIG. 1.

Referring to FIG. 2, the address latch circuit 11 may be realized using a flipflop FF21. The flipflop FF21 may latch the first to eighth address signals ADD<1:8> when the address latch pulse ALATP is generated and may output the latched signals of the first to eighth address signals ADD<1:8> as the first to eighth latched address signals LA<1:8>.

Figure 3:
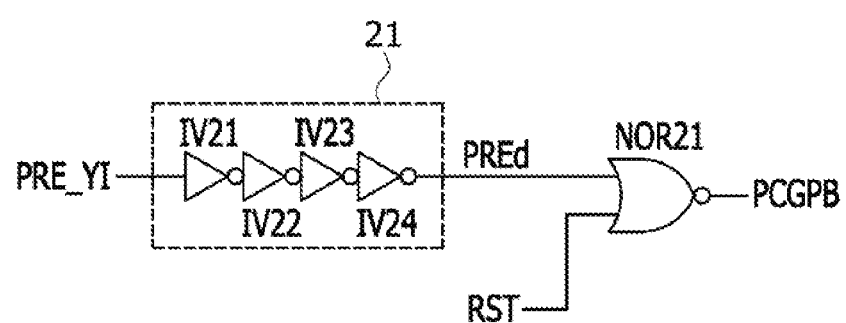
FIG. 3 is a circuit diagram illustrating an example of a pre-charge signal generation circuit included in the redundancy circuit of FIG. 1.

Referring to FIG. 3, the pre-charge signal generation circuit 13 may include a delay selection signal generation circuit 21 and a NOR gate NOR21. The delay selection signal generation circuit 21 may include inverters IV21, IV22, IV23, and IV24 which are coupled in series. The delay selection signal generation circuit 21 may delay the pre-column selection signal PRE_YI by a delay period, which is set by the inverters IV21, IV22, IV23, and IV24, to generate a delay selection signal PREd. The NOR gate NOR21 may perform a logical NOR operation of the delay selection signal PREd and the reset signal RST to generate the pre-charge signal PCGPB. The NOR gate NOR21 may generate the pre-charge signal PCGPB having a logic "low" level when at least one of the delay selection signal PREd and the reset signal RST has a logic "high" level. The pre-charge signal generation circuit 13 may generate the pre-charge signal PCGPB having a logic "low" level at a time when a delay period set by the inverters IV21, IV22, IV23, and IV24 elapses from a time when the pre-column selection signal PRE_YI is generated to have a logic "high" level for execution of the column operation. The pre-charge signal generation circuit 13 may generate the pre-charge signal PCGPB having a logic "low" level at a time when the reset signal RST is generated to have a logic "high" level.

Figure 4:
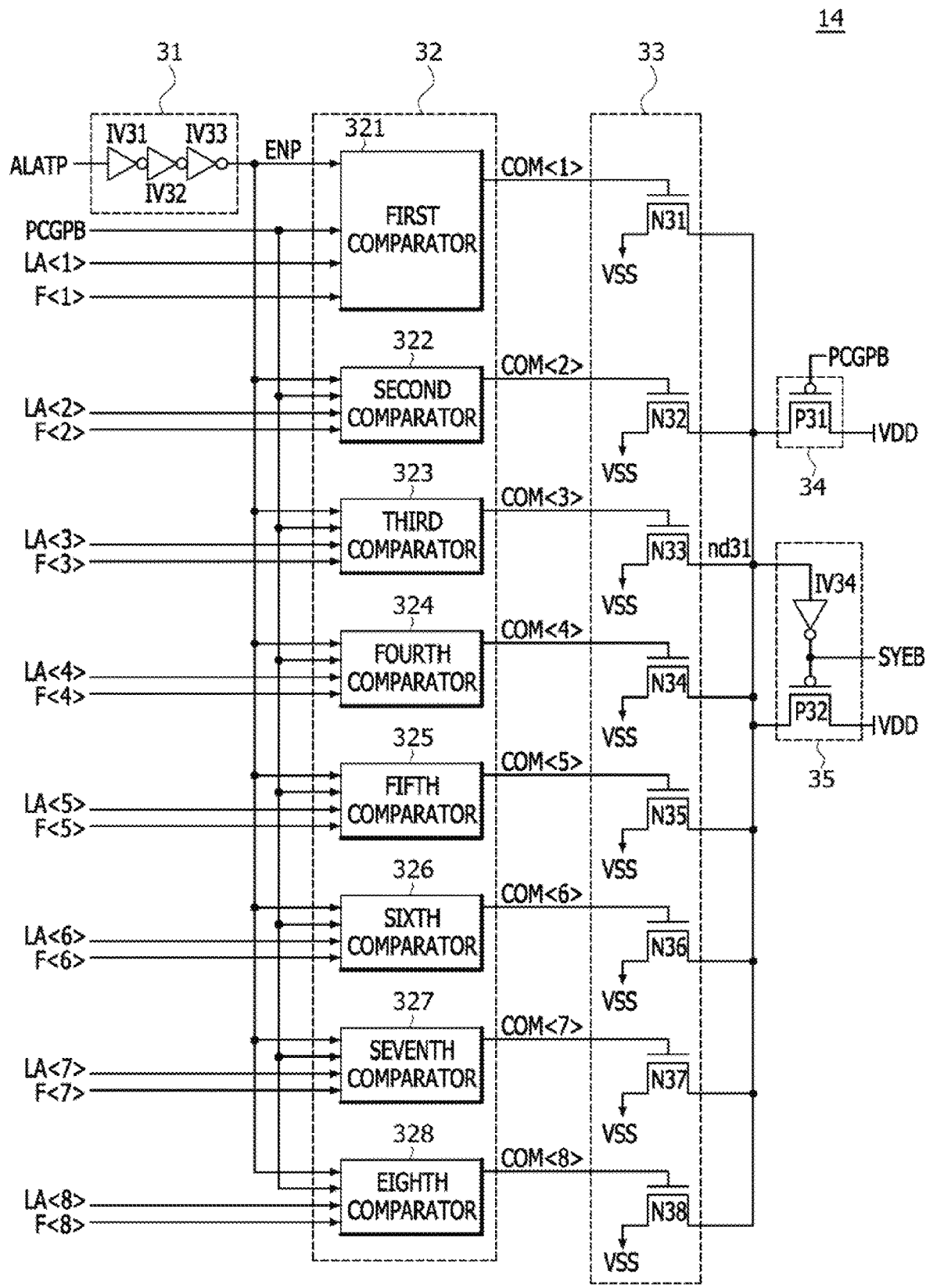
FIG. 4 is a circuit diagram illustrating an example of a selection control signal generation circuit included in the redundancy circuit of FIG. 1.

Referring to FIG. 4, the selection control signal generation circuit 14 may include an enablement pulse generation circuit 31, a comparison circuit 32, an internal node drive circuit 33, a pre-charge circuit 34, and a selection control signal output circuit 35.

The enablement pulse generation circuit 31 may include inverters IV31, IV32, and IV33. The enablement pulse generation circuit 31 may generate an enablement pulse ENP having a logic "low" level at a time when a period set by the inverters IV31, IV32, and IV33 elapses from a time when the address latch pulse ALATP is generated to have a logic "high" level.

The comparison circuit 32 may include a first comparator 321, a second comparator 322, a third comparator 323, a fourth comparator 324, a fifth comparator 325, a sixth comparator 326, a seventh comparator 327, and an eighth comparator 328.

The first comparator 321 may receive the pre-charge signal PCGPB, the enablement pulse ENP, the first latched address signal LA<1>, and the first fuse signal F<1> to generate a first comparison signal COM<1>. The first comparator 321 may initialize the first comparison signal COM<1> to a logic "low" level when the pre-charge signal PCGPB is generated. The first comparator 321 may compare the first latched address signal LA<1> with the first fuse signal F<1> to generate the first comparison signal COM<1> when the enablement pulse ENP is generated. The first comparator 321 may keep the first comparison signal COM<1> having a logic "low" level if the first latched address signal LA<1> has the same logic level as the first fuse signal F<1> when the enablement pulse ENP is generated. The first comparator 321 may generate the first comparison signal COM<1> having a logic "high" level if a logic level of the first latched address signal LA<1> is different from a logic level of the first fuse signal F<1> when the enablement pulse ENP is generated. A configuration and an operation of the first comparator 321 is described more fully below with reference to FIG. 5.

Each of the second to eighth comparators 322, 323, 324, 325, 326, 327, and 328 may be designed to have substantially the same configuration and operation as the first comparator 321. Thus, detailed descriptions of the second to eighth comparators 322, 323, 324, 325, 326, 327, and 328 are omitted for brevity.

The internal node drive circuit 33 may include NMOS transistors N31, N32, N33, N34, N35, N36, N37, and N38. The NMOS transistor N31 may drive a node nd31 to a ground voltage VSS when the first comparison signal COM<1> has a logic "high" level. The NMOS transistor N32 may drive the node nd31 to the ground voltage VSS when the second comparison signal COM<2> has a logic "high" level. The NMOS transistor N33 may drive the node nd31 to the ground voltage VSS when the third comparison signal COM<3> has a logic "high" level. The NMOS transistor N34 may drive the node nd31 to the ground voltage VSS when the fourth comparison signal COM<4> has a logic "high" level. The NMOS transistor N35 may drive the node nd31 to the ground voltage VSS when the fifth comparison signal COM<5> has a logic "high" level. The NMOS transistor N36 may drive the node nd31 to the ground voltage VSS when the sixth comparison signal COM<6> has a logic "high" level. The NMOS transistor N37 may drive the node nd31 to the ground voltage VSS when the seventh comparison signal COM<7> has a logic "high" level. The NMOS transistor N38 may drive the node nd31 to the ground voltage VSS when the eighth comparison signal COM<8> has a logic "high" level.

The pre-charge circuit 34 may include a PMOS transistor P31. The PMOS transistor P31 may drive the node nd31 to a power supply voltage VDD when the pre-charge signal PCGPB has a logic "low" level. The pre-charge circuit 34 may drive the node nd31 to the power supply voltage VDD in response to the pre-charge signal PCGPB which is generated to have a logic "low" level at a time when a predetermined delay period elapses from a time when the pre-column selection signal PRE_YI is generated to perform the column operation for receiving or outputting the data or at a time when the reset signal RST is generated to perform the initialization operation.

The selection control signal output circuit 35 may include an inverter IV34 and a PMOS transistor P32. The inverter IV34 may inversely buffer a signal of the node nd31 to output the inversely buffered signal of the signal of the node nd31 as the selection control signal SYEB. The PMOS transistor P32 may be turned on to drive the node nd31 to the power supply voltage VDD when the selection control signal SYEB has a logic "low" level. The selection control signal output circuit 35 may generate the selection control signal SYEB which is driven to a logic "high" level when the node nd31 has a logic "low" level. When the node nd31 has a logic "high" level, the selection control signal output circuit 35 may generate the selection control signal SYEB which is driven to a logic "low" level and may drive the node nd31 to the power supply voltage VDD.

When the pre-charge signal PCGPB is generated, the selection control signal generation circuit 14 may drive the node nd31 to a logic "high" level and may drive the selection control signal SYEB to a logic "low" level to initialize the selection control signal SYEB. Because all of the first to eighth comparison signals COM<1:8> are generated to have a logic "low" level if a logic level combination of the first to eighth latched address signals LA<1:8> is identical to a logic level combination of the first to eighth fuse signals F<1:8> while the address latch pulse ALATP is generated to have a logic "high" level, the selection control signal generation circuit 14 may keep the node nd31 having a logic "high" level and may keep the selection control signal SYEB having a logic "low" level. Because at least one of the first to eighth comparison signals COM<1:8> is generated to have a logic "high" level if a logic level combination of the first to eighth latched address signals LA<1:8> is different from a logic level combination of the first to eighth fuse signals F<1:8> while the address latch pulse ALATP is generated to have a logic "high" level, the selection control signal generation circuit 14 may drive the node nd31 to a logic "low" level and may drive the selection control signal SYEB having a logic "high" level. For an embodiment, the selection control signal generation circuit 14 may be realized to drive the node nd31 only if a logic level combination of the first to eighth latched address signals LA<1:8> is different from a logic level combination of the first to eighth fuse signals F<1:8>. Thus, the number of times of logical operations performed in the selection control signal generation circuit 14 may be reduced to lower the power consumption of the redundancy circuit 1 and to improve an operation speed of the redundancy circuit 1.

Figure 5:
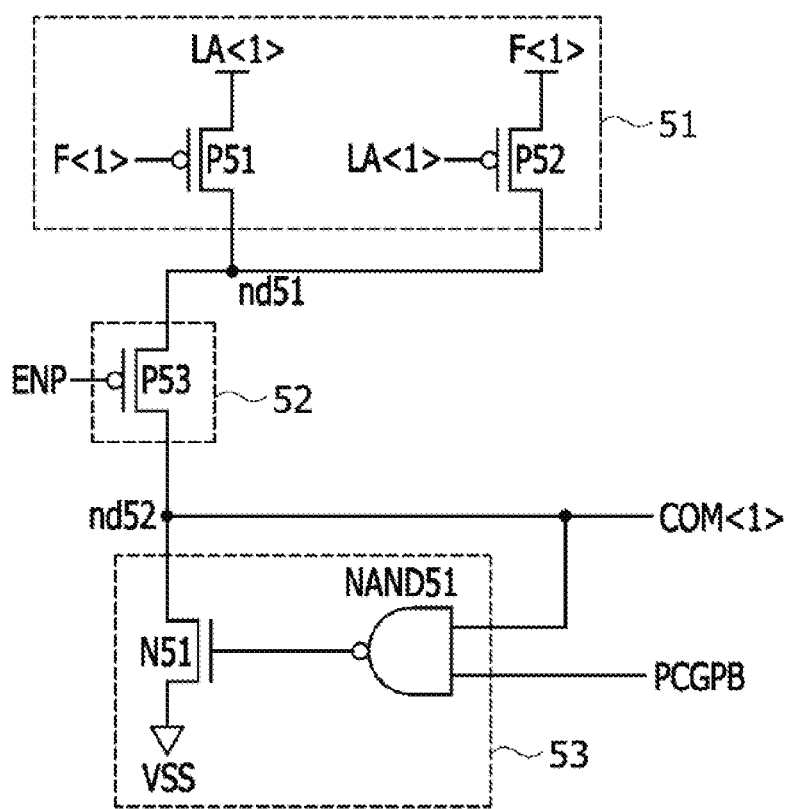
FIG. 5 is a circuit diagram illustrating an example of a first comparator included in the selection control signal generation circuit of FIG. 4.

Referring to FIG. 5, the first comparator 321 may include a comparison/drive circuit 51, an enablement drive circuit 52, and a pre-charge drive circuit 53.

The comparison/drive circuit 51 may include PMOS transistors P51 and P52. The PMOS transistor P51 may drive a node nd51 according to the first latched address signal LA<1> when the first fuse signal F<1> has a logic "low" level. The PMOS transistor P52 may drive the node nd51 according to the first fuse signal F<1> when the first latched address signal LA<1> has a logic "low" level. The comparison/drive circuit 51 may drive the node nd51 to a logic "high" level when a logic level of the first latched address signal LA<1> is different from a logic level of the first fuse signal F<1>. The comparison/drive circuit 51 may drive the node nd51 to a logic "high" level using the PMOS transistor P51 turned on when the first fuse signal F<1> has a logic "low" level and the first latched address signal LA<1> has a logic "high" level. The comparison/drive circuit 51 may drive the node nd51 to a logic "high" level using the PMOS transistor P52 turned on when the first fuse signal F<1> has a logic "high" level and the first latched address signal LA<1> has a logic "low" level. The comparison/drive circuit 51 may terminate to drive the node nd51 when the first latched address signal LA<1> and the first fuse signal F<1> have the same logic level.

The enablement drive circuit 52 may include a PMOS transistor P53. The PMOS transistor P53 may drive a node nd52 according to a level of the node nd51 when the enablement pulse ENP is generated to have a logic "low" level. The enablement drive circuit 52 may drive the node nd52 to a logic "high" level using the node nd51 having a logic "high" level when the enablement pulse ENP is generated to have a logic "low" level by the address latch pulse ALATP having a logic "high" level for the column operation and the first latched address signal LA<1> has a logic level which is different from a logic level of the first fuse signal F<1>. The first comparison signal COM<1> may be outputted through the node nd52.

The pre-charge drive circuit 53 may include a NAND gate NAND51 and an NMOS transistor N51. The NAND gate NAND51 may perform a logical NAND operation of the first comparison signal COM<1> and the pre-charge signal PCGPB. The NMOS transistor N51 may be turned on by an output signal of the NAND gate NAND51 to drive the node nd52 to the ground voltage VSS. The pre-charge drive circuit 53 may drive the first comparison signal COM<1>, which is outputted through the node nd52 by the NMOS transistor N51 turned on when the pre-charge signal PCGPB is generated to have a logic "low" level, to a logic "low" level. The pre-charge drive circuit may drive the first comparison signal COM<1>, which is outputted through the node nd52 by the NMOS transistor N51 turned on when the first comparison signal COM<1> is generated to have a logic "low" level, to a logic "low" level.

The first comparator 321 may initialize the first comparison signal COM<1> to a logic "low" level when the pre-charge signal PCGPB is generated to have a logic "low" level. The first comparator 321 may keep the first comparison signal COM<1> having a logic "low" level when the enablement pulse ENP is generated to have a logic "low" level and the first latched address signal LA<1> has the same logic level as the first fuse signal F<1>. The first comparator 321 may generate the first comparison signal COM<1> having a logic "high" level when the enablement pulse ENP is generated to have a logic "low" level and the first latched address signal LA<1> has a logic level which is different from a logic level of the first fuse signal F<1>.

For an embodiment, the first comparator 321 may be realized to drive the nodes nd51 and nd52 only if a logic level of the first latched address signal LA<1> is different from a logic level of the first fuse signal F<1> when the first latched address signal LA<1> is compared with the first fuse signal F<1> to generate the first comparison signal COM<1>. Thus, the number of times of logical operations may be reduced to lower the power consumption of the redundancy circuit 1 and to improve an operation speed of the redundancy circuit 1.

Figure 6:
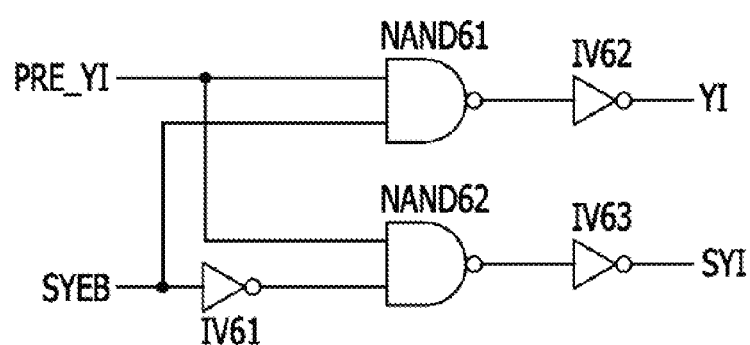
FIG. 6 is a circuit diagram illustrating an example of a column control circuit included in the redundancy circuit of FIG. 1.

Referring to FIG. 6, the column control circuit 15 may include inverters IV61, IV62, and IV63 and NAND gates NAND61 and NAND62. The inverter IV61 may inversely buffer the selection control signal SYEB to output the inversely buffered signal of the selection control signal SYEB. The NAND gate NAND61 may perform a logical NAND operation of the selection control signal SYEB and the pre-column selection signal PRE_YI. The NAND gate NAND62 may perform a logical NAND operation of the pre-column selection signal PRE_YI and an output signal of the inverter IV61. The inverter IV62 may inversely buffer an output signal of the NAND gate NAND61 to generate the column selection signal YI. The inverter IV63 may inversely buffer an output signal of the NAND gate NAND62 to generate the redundancy column selection signal SYI.

The column control circuit 15 may buffer the pre-column selection signal PRE_YI to output the buffered signal of the pre-column selection signal PRE_YI as the column selection signal YI when the selection control signal SYEB has a logic "high" level. The column selection signal YI may be generated to perform the column operation of the cells 161. The column control circuit 15 may buffer the pre-column selection signal PRE_YI to output the buffered signal of the pre-column selection signal PRE_YI as the redundancy column selection signal SYI when the selection control signal SYEB has a logic "low" level. The redundancy column selection signal SYI may be generated to perform the column operation of the redundancy cells 162 with which the cells 161 are replaced when the cells 161 are defective cells corresponding to failed cells.

As describe above, the redundancy circuit 1 according to an embodiment may be realized to drive internal nodes only if a logic level combination of the first to eighth latched address signals LA<1:8> is different from a logic level combination of the first to eighth fuse signals F<1:8> when the first to eighth latched address signals LA<1:8> are compared with first to eighth fuse signals F<1:8> to generate the first to eighth comparison signals COM<1:8>. As a result, the number of times logical operations are performed in the redundancy circuit 1 may be reduced to lower the power consumption of the redundancy circuit 1 and to improve an operation speed of the redundancy circuit 1.

Figure 7:
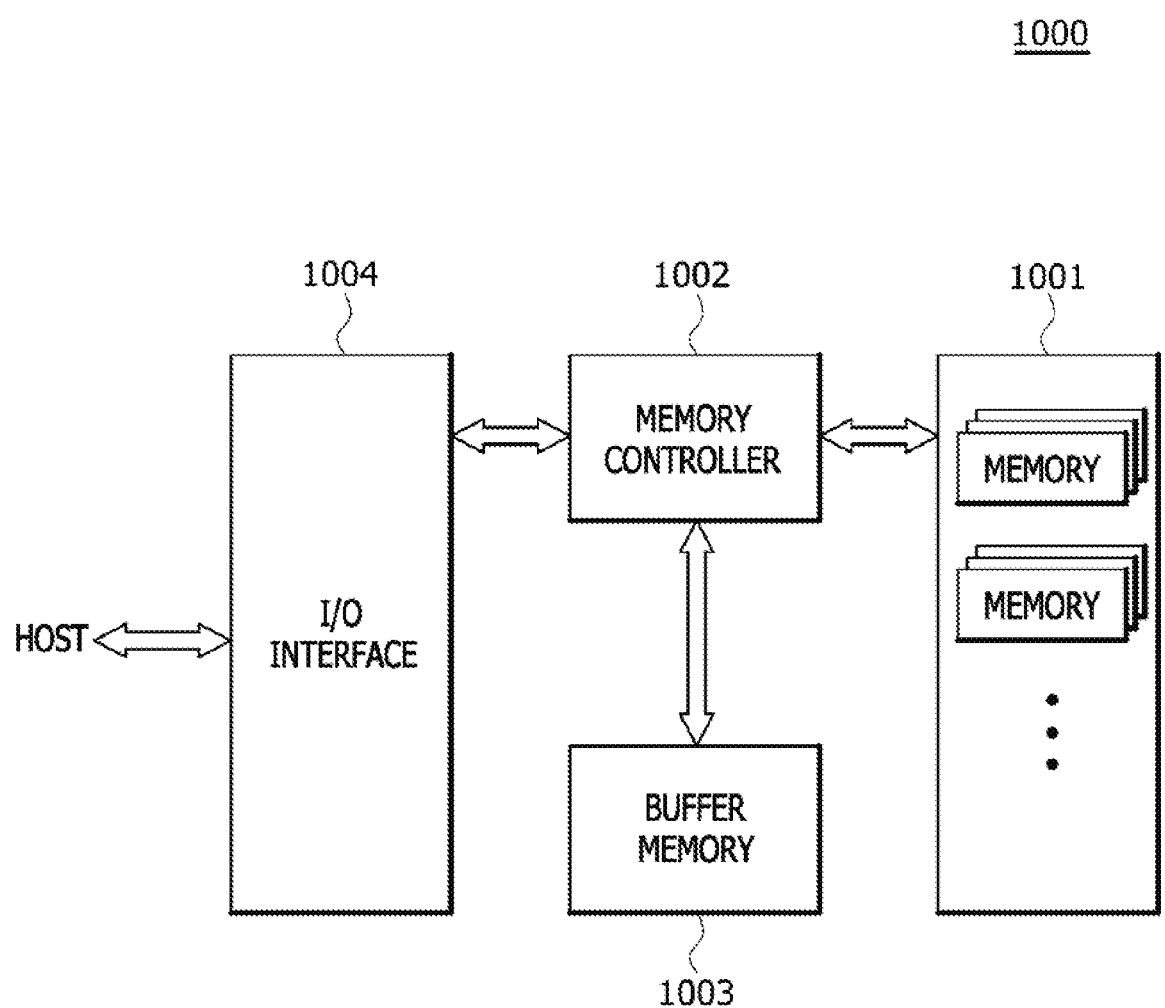
FIG. 7 is a block diagram illustrating a configuration of an electronic system employing the redundancy circuit shown in FIG. 1.

The redundancy circuit 1 described with reference to FIGS. 1 to 6 may be applied to an electronic system that includes a memory system, a graphic system, a computing system, a mobile system, or the like. For example, as illustrated in FIG. 7, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal outputted from the memory controller 1002. The data storage circuit 1001 may include the redundancy circuit 1 illustrated in FIG. 1. Meanwhile, the data storage circuit 1001 may include nonvolatile memory that can retain its stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 7 illustrates the memory controller 1002 with a single block, the memory controller 1002 may include one controller for controlling the data storage circuit 1001 and another controller for controlling the buffer memory 1003 representing volatile memory.

The buffer memory 1003 may temporarily store the data to be processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read out the data stored therein and may output the data to the memory controller 1002. The buffer memory 1003 may include a volatile memory such as a dynamic random access memory (DRAM), a mobile DRAM, or a static random access memory (SRAM). The buffer memory 1003 may include the redundancy circuit 1 illustrated in FIG. 1.

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data outputted from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A redundancy circuit comprising:
   a selection control signal generation circuit configured to drive an internal node, which is initialized, to generate a selection control signal when a logic level of a latched address signal is different from a logic level of a fuse signal; and
   a column control circuit configured to buffer a pre-column selection signal based on the selection control signal to:
      generate a column selection signal for execution of a column operation of cells; or
      generate a redundancy column selection signal for execution of the column operation of redundancy cells, wherein the internal node is driven to have a predetermined logic level when a pre-charge signal is generated.

2. The redundancy circuit of claim 1, wherein the pre-charge signal is generated:
   at a time when a predetermined delay period elapses from a time when a pre-column selection signal is generated to select a column path during the column operation; or
   at a time when a reset signal for execution of an initialization operation is generated.

3. The redundancy circuit of claim 1,
   wherein the selection control signal is driven to a first logic level by the internal node; and
   wherein the selection control signal is driven to a second logic level when the latched address signal has a logic level which is different from a logic level of the fuse signal.

4. The redundancy circuit of claim 1, wherein the selection control signal generation circuit comprises:
   a comparison circuit configured to compare the latched address signal with the fuse signal based on an enablement pulse and a pre-charge signal to generate a comparison signal; and
   an internal node drive circuit configured to drive the internal node based on the comparison signal.

5. The redundancy circuit of claim 4, wherein the enablement pulse is generated based on an address latch pulse which is created to receive an address signal for accessing cells for which the column operation is performed.

6. The redundancy circuit of claim 4, wherein the comparison circuit generates the comparison signal, which is driven to a first logic level based on the pre-charge signal, and drives the comparison signal to a second logic level when a logic level of the latched address signal is different from a logic level of the fuse signal.

7. The redundancy circuit of claim 4, wherein the internal node drive circuit drives the internal node when the comparison signal has the second logic level.

8. The redundancy circuit of claim 4, wherein the comparison circuit comprises:
   a comparison/drive circuit configured to drive a first node when a logic level of the latched address signal is different from a logic level of the fuse signal;
   an enablement drive circuit configured to drive a second node through which the comparison signal is outputted by the first node when the enablement pulse is generated; and
   a pre-charge drive circuit configured to drive the second node based on the pre-charge signal and the comparison signal.

9. The redundancy circuit of claim 8, wherein the comparison/drive circuit:
   drives the first node using the fuse signal based on the latched address signal; or
   drives the first node using the latched address signal based on the fuse signal.

10. The redundancy circuit of claim 8, wherein the pre-charge drive circuit drives the comparison signal to a first logic level when the pre-charge signal has the first logic level or the comparison signal has the first logic level.

11. The redundancy circuit of claim 4, wherein the selection control signal generation circuit further comprises a pre-charge circuit that initializes the internal node based on the pre-charge signal.

12. The redundancy circuit of claim 4, wherein the selection control signal generation circuit further comprises a selection control signal output circuit that buffers a signal of the internal node to generate the selection control signal and drives the internal node based on the selection control signal.

13. The redundancy circuit of claim 1,
   wherein the column control circuit buffers the pre-column selection signal to generate the column selection signal according to the selection control signal, which is driven to a first logic level when the latched address signal and the fuse signal have the same logic level; and
   wherein the column control circuit buffers the pre-column selection signal to generate the redundancy column selection signal according to the selection control signal, which is driven to a second logic level when the latched address signal and the fuse signal have different logic levels.

14. A redundancy circuit comprising:
   a comparison circuit configured to compare a latched address signal with a fuse signal based on an enablement pulse and a pre-charge signal to generate a comparison signal;
   an internal node drive circuit configured to drive an internal node based on the comparison signal;
   a selection control signal output circuit configured to buffer a signal of the internal node to output the buffered signal of the signal of the internal node as a selection control signal; and
   a column control circuit configured to buffer a pre-column selection signal based on the selection control signal to:
      generate a column selection signal for execution of a column operation of cells; or
      generate a redundancy column selection signal for execution of the column operation of redundancy cells, wherein the internal node is driven to have a predetermined logic level when the pre-charge signal is generated.

15. The redundancy circuit of claim 14, wherein the enablement pulse is generated based on an address latch pulse which is created to receive an address signal for accessing cells for which the column operation is performed.

16. The redundancy circuit of claim 14, wherein the pre-charge signal is generated:
at a time when a predetermined delay period elapses from a time when a pre-column selection signal is generated to select a column path during the column operation; or
at a time when a reset signal for execution of an initialization operation is generated.

17. The redundancy circuit of claim 14, wherein the comparison circuit comprises:
a comparison/drive circuit configured to drive a first node when a logic level of the latched address signal is different from a logic level of the fuse signal;
an enablement drive circuit configured to drive a second node through which the comparison signal is outputted by the first node when the enablement pulse is generated; and
a pre-charge drive circuit configured to drive the second node based on the pre-charge signal and the comparison signal.

18. The redundancy circuit of claim 17, wherein the comparison/drive circuit:
drives the first node using the fuse signal based on the latched address signal; or
drives the first node using the latched address signal based on the fuse signal.

19. The redundancy circuit of claim 17, wherein the selection control signal output circuit buffers a signal of the internal node to generate the selection control signal and drives the internal node based on the selection control signal.

* * * * *